United States Patent [19]
Anderson et al.

[11] Patent Number: 6,154,361
[45] Date of Patent: Nov. 28, 2000

[54] DISK-DRIVE CHASSIS FOR REDUCING TRANSMISSION OF VIBRATIONS BETWEEN DISK-DRIVE UNITS OF A DISK-DRIVE ARRAY

[75] Inventors: Dale H. Anderson, Tucson, Ariz.; Kenton C. Green, San Jose, Calif.; Oscar M. Herrera, Milpitas, Calif.; Kenneth R. Schneebeli; Peter P. Urbisci, both of San Jose, Calif.

[73] Assignee: International Business Machines Corporation, Armonk, N.Y.

[21] Appl. No.: 09/165,943

[22] Filed: Oct. 2, 1998

[51] Int. Cl.[7] .................... H05K 5/00; H05K 7/16; F16M 1/00; F16M 13/00; H47B 81/00

[52] U.S. Cl. .................... 361/685; 361/686; 361/685; 361/724; 361/727; 312/223.1; 312/223.2; 248/636; 248/638

[58] Field of Search .................... 361/685, 724, 361/727, 686; 248/638, 636; 312/223.2, 223.1

[56] References Cited

U.S. PATENT DOCUMENTS

| | | | |
|---|---|---|---|
| 2,701,174 | 2/1955 | Franks | 312/263 |
| 4,833,554 | 5/1989 | Dalziel et al. | 360/98.04 |
| 5,124,886 | 6/1992 | Golobay | 361/391 |
| 5,212,681 | 5/1993 | Bock | 369/244 |
| 5,247,427 | 9/1993 | Driscoll et al. | 361/685 |
| 5,340,340 | 8/1994 | Hasting et al. | 439/64 |
| 5,503,427 | 4/1996 | Ravenberg et al. | 280/728.3 |
| 5,503,472 | 4/1996 | Vu | 312/223.2 |
| 5,506,750 | 4/1996 | Carteau | 361/685 |
| 5,546,276 | 8/1996 | Cutts | 361/724 |
| 5,566,049 | 10/1996 | Nguyen | 361/685 |
| 5,652,695 | 7/1997 | Schmitt | 361/685 |
| 5,668,696 | 9/1997 | Schmitt | 361/685 |
| 5,684,671 | 11/1997 | Hobbs | 361/683 |
| 5,691,037 | 11/1997 | McCutcheon | 428/172 |
| 5,761,033 | 6/1998 | Wilhelm | 369/75.1 |

FOREIGN PATENT DOCUMENTS

| | | |
|---|---|---|
| 62-92197 | 4/1987 | Japan . |
| 3-93087 | 4/1991 | Japan . |
| 6-20460 | 1/1994 | Japan . |

OTHER PUBLICATIONS

IBM Technical Disclosure Bulletin, vol. 41, No. 01, Jan., 1998.

*Primary Examiner*—Leo P. Picard
*Assistant Examiner*—Tung Minh Bui
*Attorney, Agent, or Firm*—Gray Cary Ware Freidenrich

[57] ABSTRACT

A disk-drive chassis of the invention has stiffening and damping members for reducing the transmission of vibrations between disk-drive units of a disk-drive array. The stiffening members include vertical dividers that are mechanically coupled between top and middle panels of the chassis. The stiffening members also include a corrugated stiffener attached to a bottom surface of the middle panel. The stiffener's corrugations are aligned parallel with a spindle axis of the respective disk-drive units. The damping member includes a constrained-layer damping plate which is attached to a top surface of the top panel by a visco-elastic damping adhesive. The chassis allows improved performance by the individual disk-drive units.

29 Claims, 4 Drawing Sheets

DISK-DRIVE CHASSIS FOR REDUCING TRANSMISSION OF VIBRATIONS BETWEEN DISK-DRIVE UNITS OF A DISK-DRIVE ARRAY

BACKGROUND OF THE INVENTION

1. Field of the Invention

The present invention relates generally to a disk-drive chassis, and more particularly, to a disk-drive chassis for reducing the transmission of vibrations between adjacent disk-drive units of a disk-drive array.

2. Description of the Related Art

In an array of hard disk-drive units which are installed in a common chassis, any particular disk-drive unit may create vibrations that may affect the operation of an adjacent drive unit. For example, a drive unit generally includes a disk or platter that rotates at a constant rate. Imbalances of the platter may induce rotational vibrations in the drive unit. Further, a disk-drive unit generally includes an actuator for moving a head arm having a read/write head to a desired data track. The actuator pivots about a pivot point and thus generates (and is sensitive to) rotational vibrations. The rotational vibrations from the particular drive unit may be coupled by the chassis to adjacent drive units. Such transmitted vibrations may cause data loss and data throughput degradation because the drive's actuator may not be able to keep the drive's read/write head over the desired data track.

Accordingly, there exists a need for a disk-drive chassis that reduces the transmission of vibrations, and particularly rotational vibrations, between disk drive units of a disk drive array.

SUMMARY OF THE INVENTION

The present invention is a disk-drive chassis having a plurality of slots configured to reduce the transmission of vibrations between disk-drive units by using stiffening and damping members. The chassis allows improved performance by the individual disk-drive units of a disk-drive array.

The invention is embodied in a disk-drive chassis having an opening for receiving an array of disk-drive units. The opening is defined by an upper panel, a lower panel, and first and second side panels. The chassis further includes at least one vertical divider that extends from the upper panel to the lower panel, and a stiffener attached to at least one of the upper or lower panels for strengthening the chassis. The chassis also includes a constrained-layer damping plate attached to at least one of the upper and lower panels for damping vibrations to reduce transmission of the vibrations between the disk-drive units by the chassis.

In more detailed features of the invention, the damping plate may be attached to the upper panel by a laminate of a first layer of visco-elastic adhesive, a second layer of film, and a third layer of visco-elastic adhesive. Also, the divider, the stiffener and the damping plate may be configured to reduced the transmission between the disk-drive units of rotational vibrations.

In an alternative embodiment of the invention, the disk-drive chassis includes a plurality of slots, for retaining a respectively plurality of disk-drive units, and a corrugated stiffening member attached to a panel of the slots. Each drive unit has at least one platter that rotates about a spindle axis and the stiffener has corrugations that are oriented parallel to the spindle axes of the plurality of disk-drive units for reducing transmission of rotational vibrations.

Other features and advantages of the present invention should be apparent from the following description of the preferred embodiments, taken in conjunction with the accompanying drawings, which illustrate, by way of example, the principles of the invention.

DETAILED DESCRIPTION OF THE PREFERRED EMBODIMENTS

The invention is embodied in a disk-drive chassis configured to improve the performance of an array of disk-drive units. During normal operation, each disk-drive unit generates vibrations that may interfere with the operation of adjacent drive units. The disk-drive chassis of the invention is particularly advantageous in reducing the transmission of rotational vibrations between drive units which may interfere with data tracking by a disk-drive's head arm and cause data read errors. The disk-drive chassis of the invention reduces such data read error and thus increases the data throughput of the disk-drive units.

Figure 1:
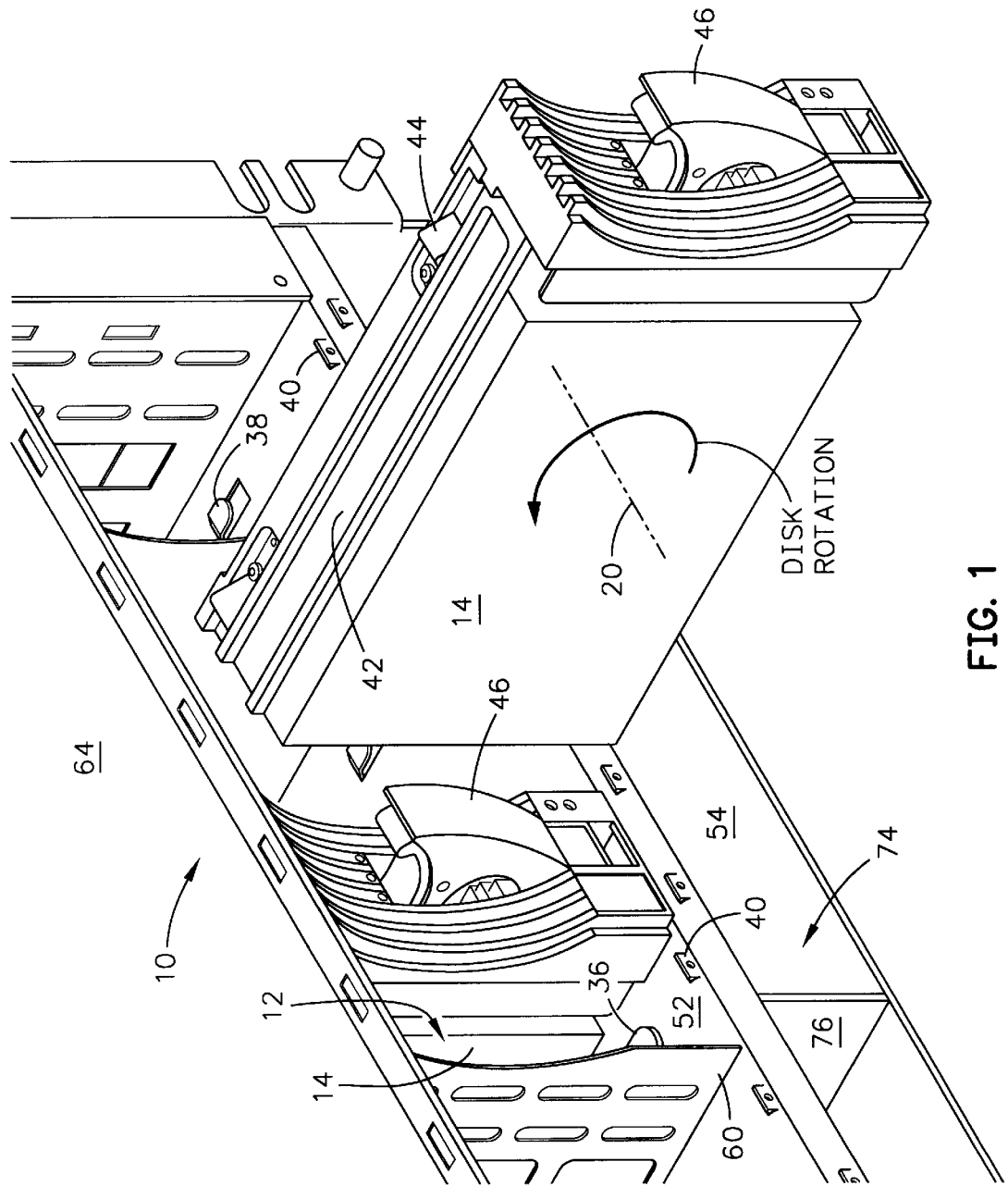
FIG. 1 is a perspective view of a disk-drive chassis having slots for receiving an array of disk drive units.
Figure 2:
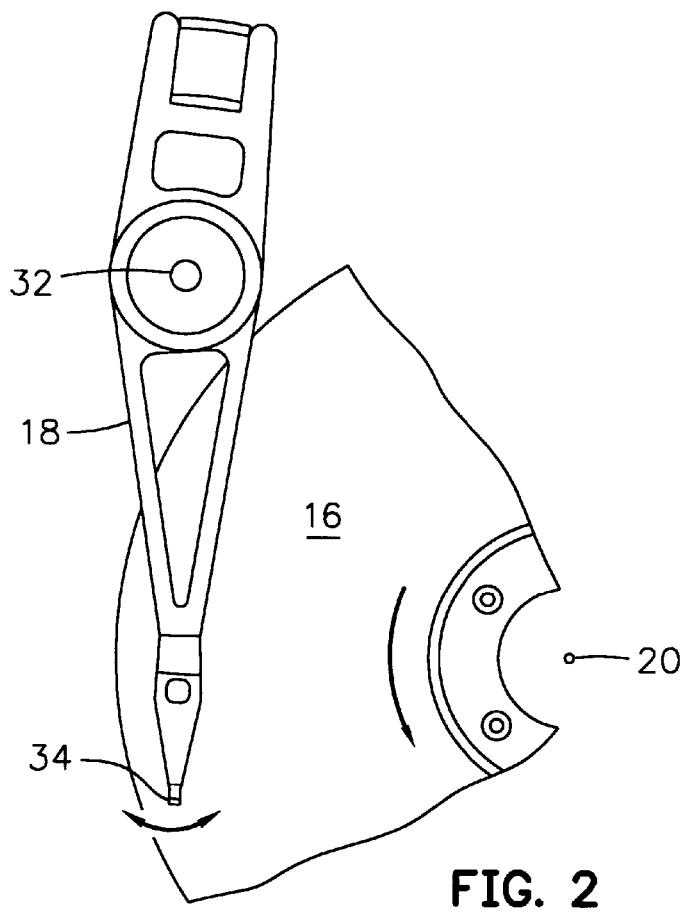
FIG. 2 is a schematic diagram of a disk platter rotating about a drive spindle and a drive head arm rotating about a pivot point.

With reference now to FIGS. 1 and 2, the disk-drive chassis 10 has a plurality of slots 12 into which the disk-drive units 14 are inserted. Each disk-drive unit has at least one internal disk platter 16 and corresponding head arm 18. The platter rotates about a spindle axis 20 at a relatively constant rate. The head arm, however, rotates about a pivot point 32 in relatively random back and forth movements as it seeks to position a read/write head 34 over data tracks on the hard-disk platter. The head arm will often change direction and is a significant source of rotational vibrations generated by a disk-drive unit. The slots includes rails 36, hooks 38 and stops 40 which are configured to engage corresponding rails 42, springs 44 and levers 46 on the disk-drive units for securely engaging the drive units to the chassis.

Figure 3:
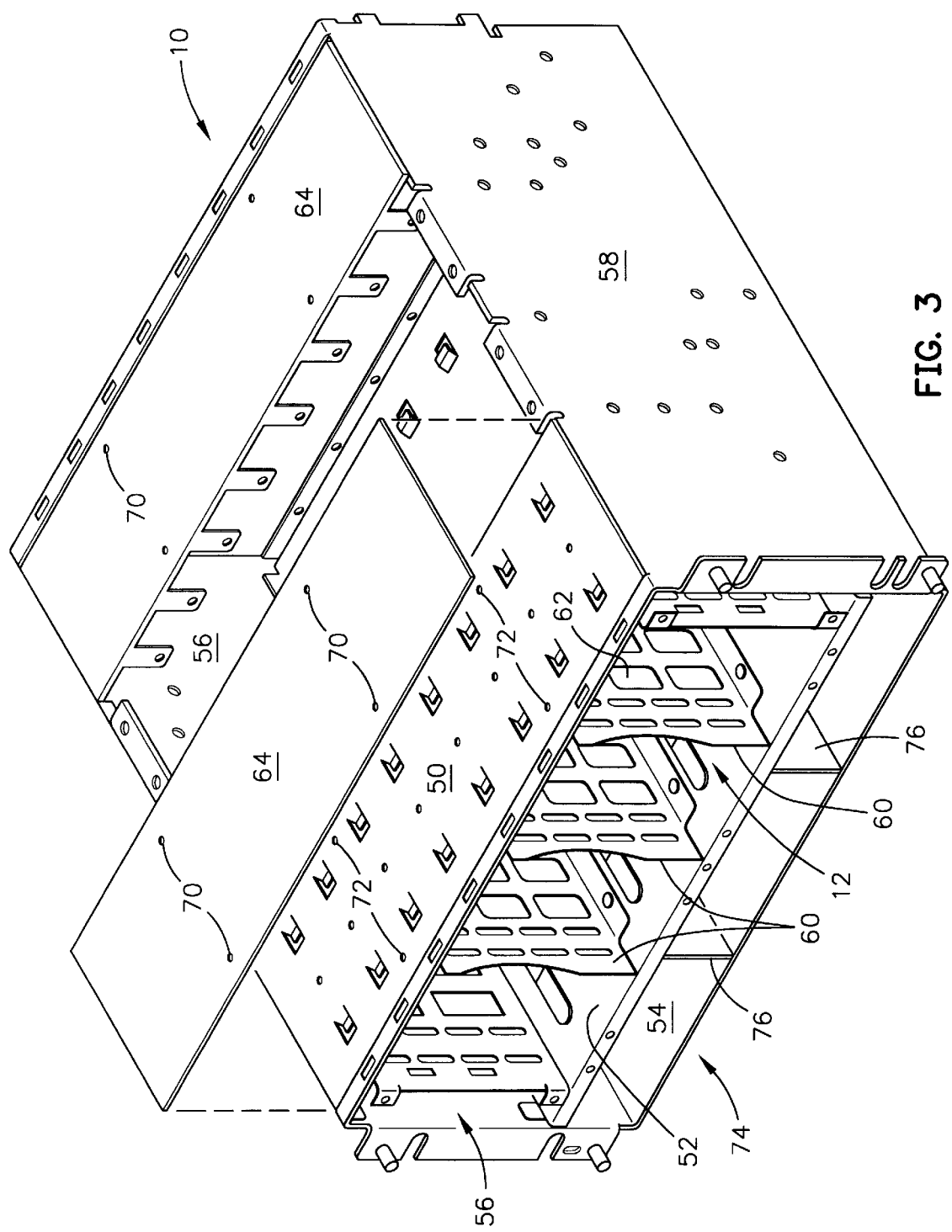
FIG. 3 is a partially exploded perspective view of the disk-drive chassis of FIG. 1 without the disk-drive units in the slots, showing dividers and dampening plates, according to the invention.

As shown in FIG. 3, the disk-drive chassis 10 has a top panel 50, a middle panel 52, a bottom panel 54, and first and second side panels, 56 and 58. The top and middle panels are welded to the first and second side panels to form a rectangular opening. Within the rectangular opening are vertical dividers 60 which divide the rectangular opening into the slots 12 for receiving the disk-drive units 14. The dividers are securely attached between the top panel and the middle panel. The dividers increase the structural strength of the chassis by mechanically coupling the top and middle panels together and thus reducing the transmission of vibrations between the disk-drive units in the slots. Cutouts 62 in the dividers are advantageous for allowing air circulation around the disk-drive units.

Figure 4:
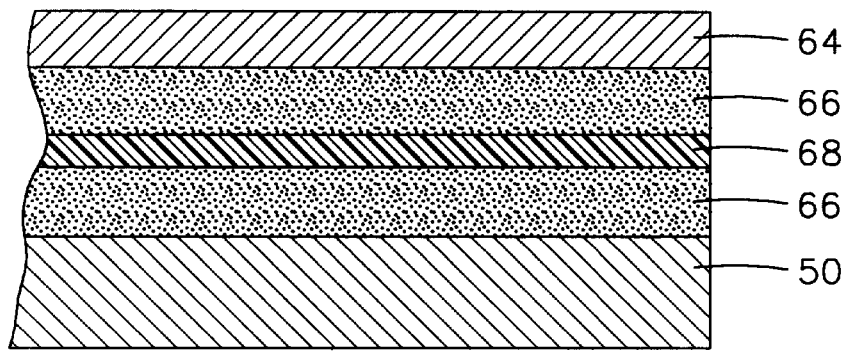
FIG. 4 is a cross-sectional view of a damping plate of FIG. 3, attached to the disk-drive chassis by a visco-elastic adhesive, according to the invention.

A constrained-layer damping plate 64 may be included on an exterior surface of the top panel 50 for absorbing vibrational energy and damping the natural rotational vibration modes of the chassis 10. The damping plate may be a steel plate which is sized to cover nearly all of the top panel's exterior surface and which is attached to the exterior surface using a visco-elastic damping adhesive 66, as shown in FIG. 4. The damping plate functions to stiffen the top panel while absorbing vibrational energy. The visco-elastic damping adhesive is a material that functions to dissipate vibrational energy so that vibrations are not as readily transmitted to and from the damping plate.

For ease of manufacture, the visco-elastic adhesive 66 is applied to both sides of a strong polyester film 68, such as Mylar. The film and adhesive is first attached to the top panel 50 and then the damping plate 64 is attached. For reducing rotational vibrations of typical platter rotational rates, e.g., at 7,200 rotations per minute (RPM), corresponding to 120 hertz (Hz), and at 10,000 RPM, corresponding to 167 Hz, as well as random rotational vibrations induced by the disk-drive actuators typically having a frequency between 0 Hz and 1 KHz, advantageously the steel damping plate has a thickness of 1.5 millimeters, the film has a thickness of 51 microns (2 mils), and the adhesive has a thickness of 51 microns (2 mils) on both sides of the film, for a total thickness of 153 microns (6 mils) of adhesive and film laminate between the top panel and the damping plate. A suitable visco-elastic adhesive for attaching the damping plate to the top panel includes RA-980, available from Anatrol of Sunnyvale, Calif. The damping plate may further include alignment holes 70 for alignment with corresponding holes 72 in the top panel for ease of manufacture.

Between the middle panel and the bottom panel is an opening 74 for housing other related electronic equipment. The opening may be divided into smaller compartments by several partitions 76. The chassis 10 may be "double ended" in that it may have slots 12 on two ends for receiving the disk-drive units 14.

Figure 5:
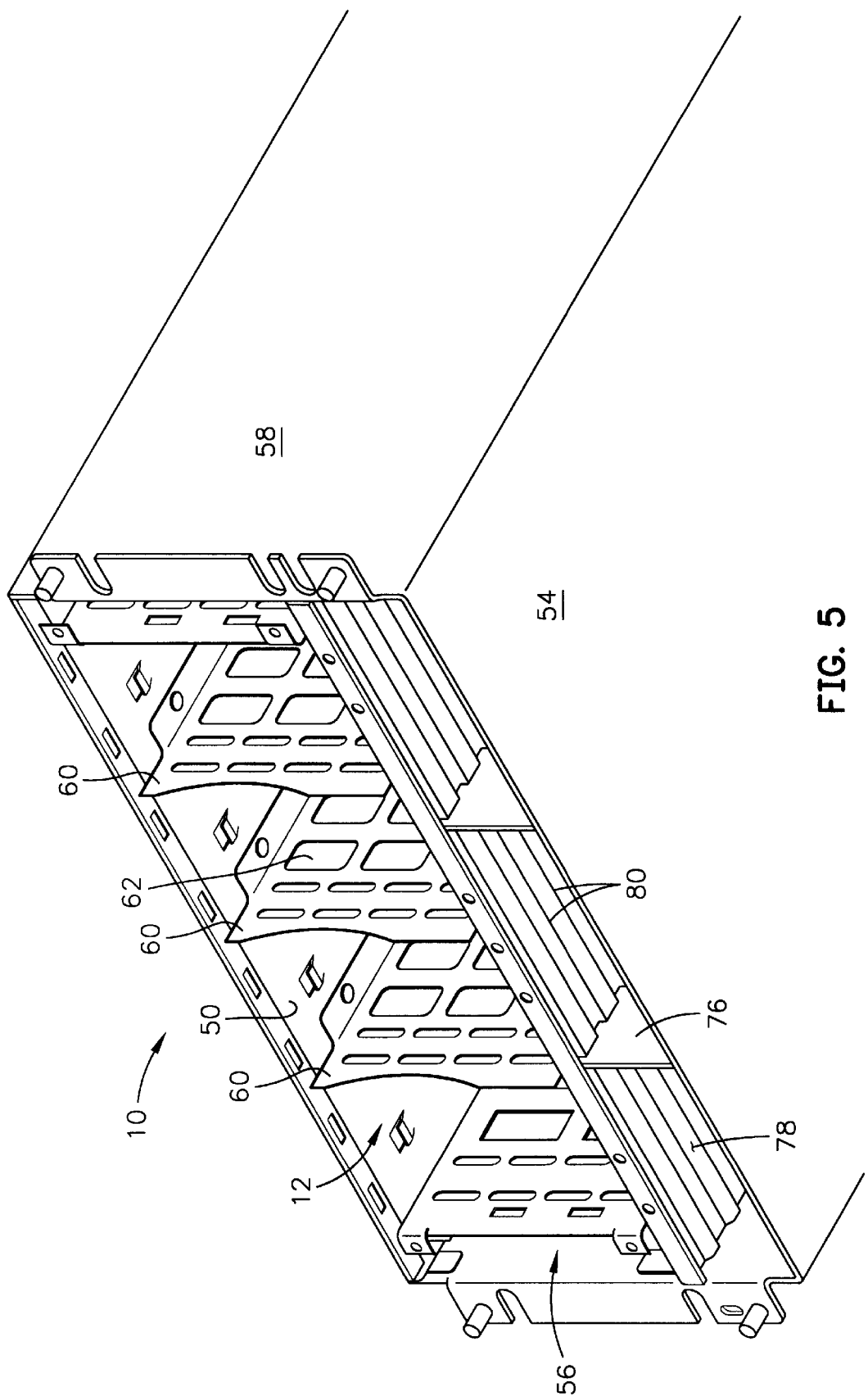
FIG. 5 is a perspective view of the disk-drive chassis of FIG. 1, without the drive units in the slots, showing a corrugated stiffener and the dividers, according to the invention.

The disk-drive chassis 10 may further include a corrugated stiffener 78, as shown in FIG. 5, for strengthening the middle panel 52. The corrugated stiffener may be spot welded to a bottom surface of the middle panel. The corrugated stiffener has ridges 80 which are preferable aligned to be parallel with the spindle axis 20 (FIGS. 1 and 2) of the disk drives. Aligning the ridges to be parallel with the spindle axis has been found to be particularly advantageous for reducing the transmission of rotational vibrations between disk-drive units 14.

As a result of increasing the stiffness of the chassis using the stiffener 78 and the vertical dividers 60, and damping the vibrational modes of the chassis using the constrained-layer damping plate 64, the disk-drive chassis 10 of the invention has been found to lower a disk-drive unit's tracking degradation by 0.2 micro inches which is an improvement of about 50 percent. Further, the chassis of the invention advantageously has no amplifying rotational vibration modes at typical platter rotational rates.

While the foregoing has been with reference to specific embodiments of the invention, it will be appreciated by those skilled in the art that these are illustrations only and that changes in these embodiments can be made without departing from the principles of the invention, the scope of which is defined by the appended claims.

What is claimed is:

1. A disk-drive chassis for receiving an array of disk-drive units, the chassis comprising:

an upper panel, a lower panel, and first and second side panels that are configured to define an opening for receiving the disk-drive units;

at least one vertical divider that extends from the upper panel to the lower panel for strengthening the chassis;

a stiffener attached to at least one of the upper or lower panels for strengthening the chassis; and a constrained-layer damping plate attached to at least one of the upper and lower panels for damping vibrations to reduce transmission of the vibrations between the disk-drive units by the chassis, wherein the damping plate is attached to the upper panel by a laminate of a first layer of visco-elastic adhesive, a second layer of film, and a third layer of visco-elastic adhesive.

2. A disk-drive chassis as defined in claim 1, wherein the damping plate is a steel plate having a thickness of about 1.5 millimeters, and the first, second and third layers each have a thickness of about 50 microns.

3. A disk-drive chassis as defined in claim 1, wherein the divider, stiffener and damping plate are configured to reduced the transmission between the disk-drive units of rotational vibrations having a frequency between 0 hertz and 1000 hertz.

4. A disk-drive chassis as defined in claim 1, wherein the divider, the stiffener and the damping plate are configured to reduce the transmission between the disk-drive units of rotational vibrations.

5. A disk-drive chassis as defined in claim 1, wherein the damping plate includes at least one alignment hole for aligning with a corresponding alignment hole in the upper panel.

6. A disk-drive chassis as defined in claim 1, wherein the divider has cutouts for providing improved air circulation with the chassis.

7. A disk-drive chassis as defined in claim 1, wherein the stiffener is corrugated and is spot welded to the lower panel.

8. A disk-drive chassis as defined in claim 1, wherein the opening is configured to removably engage the disk-drive units.

9. A disk-drive chassis as defined in claim 1, wherein the chassis has two opposed openings for receiving the disk-drive units.

10. A disk-drive chassis, comprising:

a plurality of slots for retaining a plurality of disk-drive units, respectively, each drive unit having at least one platter that rotates about a spindle axis, and a corrugated stiffening member attached to a panel of the slots and configured to reduce transmission of rotational vibrations between disk-drive units retained in the plurality of slots.

11. A disk-drive chassis as defined in claim 10, wherein the stiffener has corrugations that are oriented parallel to the spindle axes of the plurality of disk-drive units.

12. A disk-drive chassis as defined in claim 10, further comprising a plurality of dividers between the plurality of slots for strengthening the chassis.

13. A disk-drive chassis as defined in claim 10, wherein the slots are configured to removably engage the disk-drive units.

14. A disk-drive chassis as defined in claim 12, further comprising a constrained-layer damping plate attached along an external panel of the chassis that is common to the plurality of slots.

15. A disk-drive chassis, comprising:

means for retaining an array of disk-drive units;

corrugated stiffening means coupled to the retaining means for reducing transmission of rotational vibrations between disk-drive units;

vertical dividing means coupled to the retaining means for strengthen the chassis and for reducing transmission of rotational vibrations between disk-drive units; and a damping means coupled to the retaining means for damping natural vibration modes of the chassis.

16. A disk-drive chassis as defined in claim 15, wherein the stiffening means, dividing means and damping means are configured to reduce the transmission between the disk-drive units of rotational vibrations having a frequency between 0 hertz and 1000 hertz.

17. A disk-drive chassis as defined in claim 16, wherein the stiffening means, dividing means and damping are configured to reduce the transmission between the disk-drive units of rotational vibrations.

18. A disk-drive chassis as defined in claim 16, wherein the drive units are removably engaged in the chassis by the retaining means.

19. A disk-drive chassis as defined in claim 16, wherein the chassis has two opposed retaining means for receiving, respectively, two arrays of disk-drive units.

20. A disk-drive chassis for receiving an array of disk-drive units, the chassis comprising:

an upper panel, a lower panel, and first and second side panels that are configured to define an opening for receiving the disk-drive units;

at least one vertical divider that extends from the upper panel to the lower panel for strengthening the chassis;

a stiffener attached to at least one of the upper or lower panels for strengthening the chassis; and a constrained-layer damping plate attached to at least one of the upper and lower panels for damping vibrations to reduce transmission of the vibrations between the disk-drive units by the chassis, wherein the damping plate includes at least one alignment hole for aligning with a corresponding alignment hole in the upper panel.

21. A disk-drive chassis as defined in claim 20, wherein the damping plate is attached to the upper panel by a laminate of a first layer of visco-elastic adhesive, a second layer of film, and a third layer of visco-elastic adhesive.

22. A disk-drive chassis as defined in claim 20, wherein the divider, stiffener and damping plate are configured to reduce the transmission between the disk-drive units of rotational vibrations having a frequency between 0 hertz and 1000 hertz.

23. A disk-drive chassis as defined in claim 20, wherein the divider, the stiffener and the damping plate are configured to reduced the transmission between the disk-drive units of rotational vibrations.

24. A disk-drive chassis as defined in claim 20, wherein the divider has cutouts for providing improved air circulation with the chassis.

25. A disk-drive chassis as defined in claim 20, wherein the stiffener is corrugated and is spot welded to the lower panel.

26. A disk-drive chassis as defined in claim 20, wherein the opening is configured to removably engage the disk-drive units.

27. A disk-drive chassis as defined in claim 20, wherein the chassis has two opposed openings for receiving the disk-drive units.

28. A disk-drive chassis as defined in claim 21, wherein the damping plate is a steel plate having a thickness of about 1.5 millimeters, and the first, second and third layers each have a thickness of about 50 microns.

29. A disk-drive chassis for receiving an array of disk-drive units, the chassis comprising:

an upper panel, a lower panel, and first and second side panels that are configured to define an opening for receiving the disk-drive units;

at least one vertical divider that extends from the upper panel to the lower panel for strengthening the chassis;

a stiffener attached to at least one of the upper or lower panels for strengthening the chassis, wherein the stiffener is corrugated and is spot welded to the lower panel; and a constrained-layer damping plate attached to at least one of the upper and lower panels for damping vibrations to reduce transmission of the vibrations between the disk-drive units by the chassis.

* * * * *